(12) United States Patent
Gessert et al.

(10) Patent No.: US 8,734,621 B2
(45) Date of Patent: May 27, 2014

(54) TRANSPARENT CONDUCTING OXIDES AND PRODUCTION THEREOF

(75) Inventors: Timothy A. Gessert, Conifer, CO (US); Yuki Yoshida, Palo Alto, CA (US); Timothy J. Coutts, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 672 days.

(21) Appl. No.: 11/718,628

(22) PCT Filed: Jan. 16, 2007

(86) PCT No.: PCT/US2007/060553
§ 371 (c)(1),
(2), (4) Date: May 4, 2007

(87) PCT Pub. No.: WO2008/088551
PCT Pub. Date: Jul. 24, 2008

(65) Prior Publication Data
US 2011/0084239 A1    Apr. 14, 2011

(51) Int. Cl.
*C23C 14/00* (2006.01)
*C23C 14/34* (2006.01)

(52) U.S. Cl.
USPC ............. 204/192.29; 204/192.1; 204/192.11; 204/192.15; 252/519.51

(58) Field of Classification Search
USPC ............. 252/500, 520.1, 520.2, 520.4, 520.5, 252/518.1, 519.51; 204/192.1, 192.11, 204/192.15, 192.29
See application file for complete search history.

(56) References Cited

U.S. PATENT DOCUMENTS

| | | | |
|---|---|---|---|
| 4,395,467 A | 7/1983 | Vossen et al. | |
| 6,042,752 A | 3/2000 | Mitsui | |
| 6,677,063 B2 | 1/2004 | Finley | |
| 6,908,782 B2 | 6/2005 | Yan | |
| 6,936,761 B2 | 8/2005 | Pichler | |
| 7,071,121 B2 | 7/2006 | Punsalan et al. | |
| 2002/0036286 A1 | 3/2002 | Ho et al. | |
| 2003/0218153 A1* | 11/2003 | Abe ........................... | 252/500 |
| 2007/0007125 A1 | 1/2007 | Krasnov | |

OTHER PUBLICATIONS

NREL PCT/04-11, PCT/US2007/060553 International Search Report patent family members.

* cited by examiner

*Primary Examiner* — Mark Kopec
*Assistant Examiner* — Haidung Nguyen
(74) *Attorney, Agent, or Firm* — John C. Stolpa

(57) ABSTRACT

Transparent conducting oxides and production thereof are disclosed. An exemplary method of producing a transparent conducting oxide (TCO) material may comprise: providing a TCO target (110) doped with either a high-permittivity oxide or a low-permittivity oxide in a process chamber (100). The method may also comprise depositing a metal oxide on the target (110) to form a thin film having enhanced optical properties without substantially decreasing electrical quality.

16 Claims, 5 Drawing Sheets

TRANSPARENT CONDUCTING OXIDES AND PRODUCTION THEREOF

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

TECHNICAL FIELD

The described subject matter relates to transparent conducting oxides and production thereof.

BACKGROUND ART

Transparent conducting oxide (TCO) coatings may be applied to substrates or over-coated on top of other previously deposited layers. Such layers may exhibit high transparency with electrical conductivity ranging from semiconducting to highly conducting. Accordingly, these coatings, or "thin films" as they are often referred to, may be used for a wide range of opto-electronic applications. For example, thin films may be used in the manufacture of electronic devices, such as, liquid crystal displays (LCDs), and touch panel devices (e.g., personal digital assistants (PDAs) and electronic controllers), photovoltaic solar cells and transparent thin film transistors to name only a few examples.

Known deposition techniques may be implemented during the manufacture process to deposit a metal oxide as the thin film on a substrate. Indium Tin Oxide (also commonly referred to as ITO) is often used because it can be deposited at low temperatures, results in smooth films, can be readily etched, and exhibits thermal stability. However, other amorphous or polycrystalline metal oxides may also be used depending on the desired properties of the thin film, cost, operational parameters, and other factors. Furthermore, vacuum deposition using sputtering is a large area process that is widely used in the coating industry.

Achieving the desired opto-electronic properties of the thin film is typically dependent on the amount of oxygen introduced during the deposition process. Unfortunately, controlling the amount of oxygen (or its partial pressure) can be very difficult, especially in large-area production sputtering systems. For example, the amount of oxygen from the target changes with target use. Oxygen from the substrate and internal surfaces of the vacuum chamber is subject to seasonal/daily humidity variations. Maintenance activities also alter outgassing of internal surfaces. In addition, there can also be air leaks in the system. Accordingly, optimizing TCO film properties by controlling the oxygen partial pressure is a delicate process, and ensuring film reproducibility is time consuming and expensive.

The foregoing examples of the related art and limitations related therewith are intended to be illustrative and not exclusive. Other limitations of the related art will become apparent to those of skill in the art upon a reading of the specification and a study of the drawings.

DISCLOSURE OF INVENTION

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

An exemplary method of producing a transparent conducting oxide (TCO) material may comprise: providing a TCO target doped with a high-permittivity oxide in a process or vacuum deposition chamber of about 350° C., and depositing a metal oxide on a substrate from a target in the process chamber to form a thin film having enhanced optical properties without substantially decreasing electrical quality. In this example, the thin film has a high infrared transparency and exhibits highly conducive properties.

Another exemplary method of producing a TCO material may comprise: providing a TCO target doped with a material that yields a low-permittivity oxide placing the target into a process chamber, and depositing a metal oxide on a substrate from a target in the process chamber to form a thin film having enhanced optical properties without substantially decreasing electrical quality. In this example, the thin film has a lower infrared transparency.

An exemplary method of optimizing electrical and optical; properties of a TCO thin film may comprise: providing a TCO target with a dopant that widens the range of oxygen partial pressures needed during deposition, and depositing a metal oxide film on a substrate from a target in the process chamber to form the TCO thin film. Exemplary TCO thin films produced according to the methods described herein may exhibit desirable properties such as high electrical conductivity, high (or low) transparency, and/or other desirable opto-electronic properties.

In addition, to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

BEST MODE FOR CARRYING OUT THE INVENTION

Briefly, a sputter deposition process to make transparent conducting oxides (TCOs) may be implemented using either a metallic target in an oxygen atmosphere or a ceramic metal oxide target in an atmosphere which may or may not contain oxygen. Electrical and/or optical properties of the transparent conducting oxides may be controlled by varying the ratio of metals and/or the oxygen (e.g., wt %, stoichiometry partial pressure, etc.) during the sputter deposition process. Accordingly, the transparent conducting oxides produced according to the methods disclosed herein have application in a wide variety of opto-electronic devices. Exemplary transparent conducting oxides and methods of production thereof may be better understood with reference to the Figures and following discussion.

Figure 1:
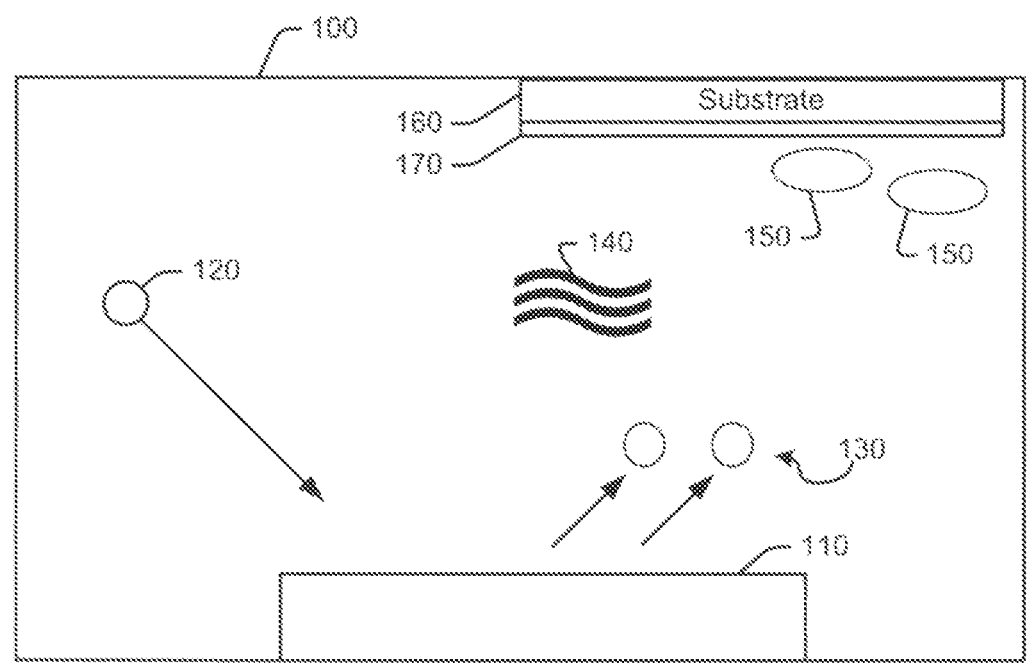
FIG. 1 is a high-level schematic illustration of an exemplary sputtering process for producing transparent conducting oxides.

FIG. 1 is a high-level schematic illustration of an exemplary sputtering process for producing transparent conducting oxides. Sputtering is a physical vapor deposition (PVD) process well known as a means of depositing metal oxide layers (or thin films) on a substrate.

In an exemplary embodiment, the deposition process may be implemented as radio-frequency (RF) magnetron sputtering. A process chamber 100 is provided with a ceramic metal oxide alloy referred, to as the target 110. The target 110 may include one or more metal species (e.g., Cu, In, Zn, Ga, Cd, Sn, Al, Ti, and Sb, etc., including others that will be apparent to those skilled in the art). For purposes of illustration, the target 110 in FIG. 1 includes In and Sn. Alternatively, separate targets may be provided for each metal oxide.

It is noted that metal and/or metal alloy targets may be used in place of metal oxide targets. It is also noted that direct current (DC) sputtering may also be used instead of RF sputtering. It is also noted that the metal or metal-oxide target may be bombarded by ions from a separate ion source.

During the deposition process, the target 110 may be bombarded by ions 120 (e.g., Argon 40), which causes constituent atoms 130 (e.g., In, Sn, and oxygen ions) to be ejected from the surface of the target 110. These constituent atoms traverse the distance between the target and substrate and recombine to form metal oxide films on the substrate.

In exemplary embodiments, the substrate material 160 may be an electrically conducting and/or transparent material, e.g., a tin oxide-coated glass, copper, aluminum or other material. However, the substrate material 160 is not limited to any particular type of material. The substrate material 160 will depend at least to some extent on the application, as will be understood by those having ordinary skill in the art after becoming familiar with the teachings herein. The metal oxide coating may also be over-coated on previously deposited and processed layers on the substrate, such as, e.g., when making a top contact to a opto-electronic device with a layered structure.

It is noted that the deposition process may also include additional operations. In an exemplary embodiment, the substrate material 160 having the deposited metal oxide thin film 170 may be thermally annealed. Other operations may also include varying operating parameters, e.g., temperature, relative concentrations of the metal ions, etc. Still other operations may also be implemented, as may be required to produce composite materials with the desired physical and electronic properties.

Before continuing, it is also noted that the deposition process described above with reference to FIG. 1 is provided for purposes of illustration and is not intended to be limiting. Other types of deposition processes, e.g., chemical vapor deposition, physical vapor deposition or others, now known or later developed, are also contemplated as being suitable for the described purposes.

Optimization of the properties of transparent conducting oxides involves maximizing their optical transmittance and electrical conductivity. Generally, these two characteristics are conflicting. That is, increasing either one usually means decreasing the other. Various figures-of-merit describing the performance of transparent conducting oxides have been used bet a useful definition is given by equation (1), where A is the optical absorbance and $R_W$ is the sheet resistance (Ω per square).

$$\phi = \log A/R_W, \qquad \text{Equation (1)}$$

The optical absorbance is generally expressed by Beer's law, in which $\alpha$ is the optical absorption coefficient (cm$^{-1}$) and t is the thickness (cm).

$$A = \exp(-\alpha t), \qquad \text{Equation (2)}$$

Substitution of equation (2) in equation (1), and knowing that R=ρ/t, gives equation (3), where σ is the conductivity (i.e., the reciprocal of the resistivity, ρ), and the dimensions of φ are ohms$^{-1}$.

$$\phi = \sigma/\alpha. \qquad \text{Equation (3)}$$

Unlike other figures-of-merit, this quantity is independent of film thickness and depends only on fundamental properties of the material. Increasing the figure-of-merit may be achieved by an increase in conductivity, without an equal increase in optical absorption, or by a decrease in optical absorption, without an equivalent decrease in conductivity.

The absorption coefficient may be expressed in terms of the extinction coefficient, k, with λ being the wavelength.

$$\alpha = \frac{4\pi k}{\lambda}, \qquad \text{Equation (4)}$$

Now from Maxwell's theory of electromagnetic radiation, the imaginary part of the dielectric permittivity is given by equation 5, where N is the refractive index.

$$\epsilon_2 = 2Nk, \qquad \text{Equation (5)}$$

In addition, Drude's theory of free electrons gives equation 6, where n is the free-carrier concentration (m$^{-3}$), e is the electronic charge (coulombs), $\epsilon_0$ is the permittivity of free space (farads m$^{-1}$), ω is the angular frequency of the radiation (s$^{-1}$) and τ is the relaxation time (s).

$$\varepsilon_2 = \left(\frac{ne^2}{\varepsilon_0 m^*}\right)\frac{1}{\omega^3 \tau}. \qquad \text{Equation (6)}$$

Hence, an alternative expression for the extinction coefficient is derived in equation (7).

$$k = \frac{1}{2N}\left(\frac{ne^2}{\varepsilon_0 m^*}\right)\frac{1}{\omega^3 \tau} \qquad \text{Equation (7)}$$

Substituting equation (7) into equation (3) results in equation 8.

$$\alpha = \frac{4\pi}{\lambda}\left(\frac{ne^2}{\varepsilon_0 m^*}\right)\frac{1}{2N\omega^3 \tau}. \qquad \text{Equation (8)}$$

In addition, equation (9) can be substituted into equation (8) to give equation 10.

$$\lambda = \frac{2\pi c}{\omega} \quad \text{Equation (9)}$$

$$\alpha = \frac{1}{Nc}\left(\frac{ne^2}{\varepsilon_0 m^*}\right)\frac{1}{\omega^2 \tau}. \quad \text{Equation (10)}$$

This expression may now be substituted into equation (2) and, knowing that $\sigma = ne\mu$, equation (11) may be derived, which reveals the significance of the relaxation time, $\tau$.

$$\phi = Nc\varepsilon_0 \tau^2 \omega^2, \quad \text{Equation (11)}$$

Equation 12 is from Maxwell's theory, where $\varepsilon_1$ is the real part of the dielectric permittivity, which is dimensionless.

$$\varepsilon_1 = N^2 - k^2. \quad \text{Equation (12)}$$

For most of the visible spectrum, $k \sim 0$ so $N = \sqrt{\varepsilon_1}$. Therefore, substituting the latter expression into equation (11) results in equation (13).

$$\phi = \sqrt{\varepsilon_1} c \varepsilon_0 \tau^2 \omega^2. \quad \text{Equation (13)}$$

This shows that the figure-of-merit increases with the square root of the real part of the dielectric permittivity. This is true irrespective of the magnitudes of N and k. Hence, an increase in the permittivity of a TCO leads to an increase in its figure-of-merit for a given relaxation time. Although $\tau$ is a more sensitive factor (i.e., the figure-of-merit increases as its square), the influence of the permittivity has not generally been appreciated. However, this dependence helps to explain the results obtained with $ZrO_2$ added to indium oxide. That is, the zirconia has a very large permittivity and, even in relatively small concentrations, may make a significant, difference to the optical properties.

A method for producing TCO films may comprise: adding small amounts of oxides that have large values of high-frequency dielectric permittivity, $\varepsilon_\infty$ ($TiO_2$, $ZrO_2$, $HfO_2$, etc) to traditional TCO materials (e.g., $In_2O_3$:Sn, $SnO_2$:F, ZnO:Al, etc). Such an embodiment improves the optical transmission of the resulting TCO film without reducing the electrical quality of the film.

In this method, the optical absorption, of a TCO film is not only a function of its oxygen content (as discussed above) but also of its high-frequency dielectric permittivity (e). Using these formalisms, the effect can be mathematically modeled by systematically varying $\varepsilon_\infty$ from a value of 4 to a value of 7 and observing the effect this has on the optical performance of a typical TCO. This range of $\varepsilon_\infty$ is consistent with expected variations in the TCO films.

Figure 2:
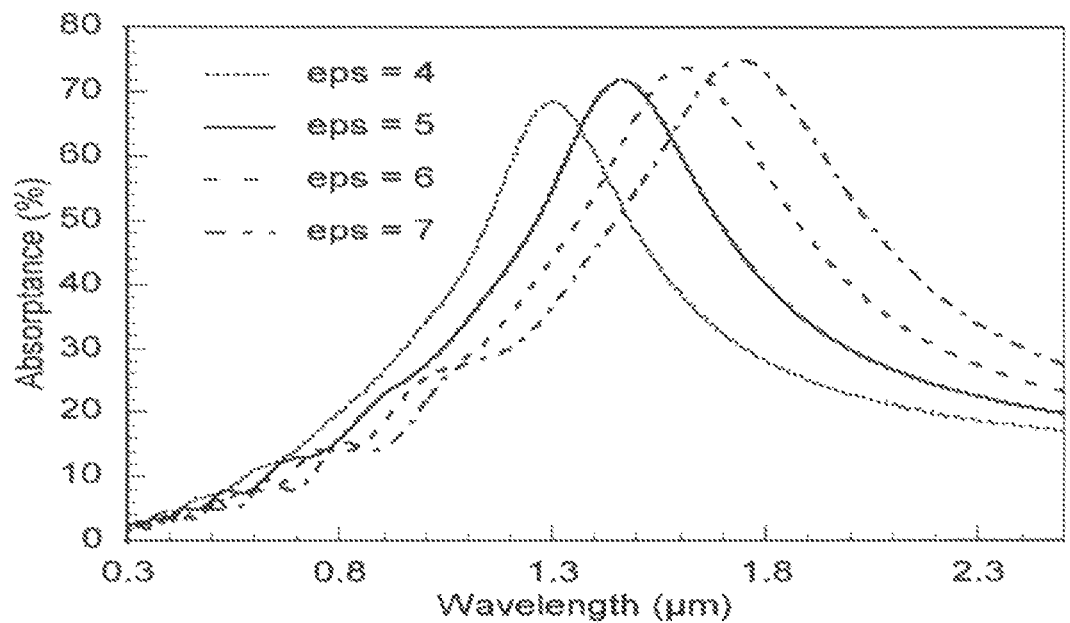
FIG. 2 is a plot showing modeled absorption, as a function of wavelength, for four exemplary TCO films.
Figure 3:
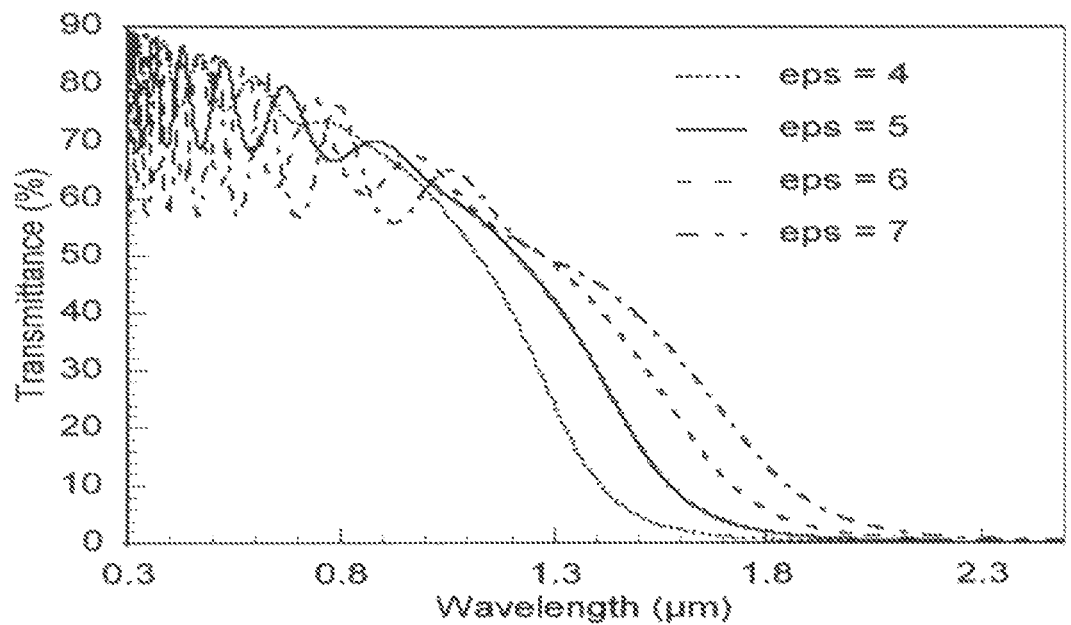
FIG. 3 is a plot showing modeled transmittance as a function of wavelength for the same set of exemplary films shown, in FIG. 2.
Figure 4:
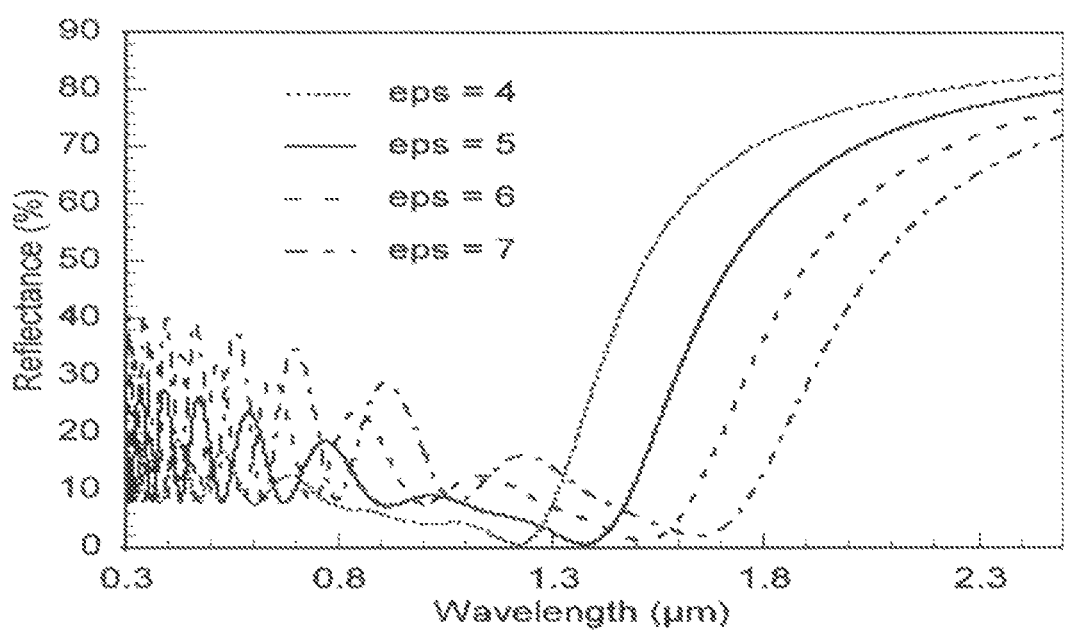
FIG. 4 is a plot showing modeled reflectance as a function of wavelength for the same set of exemplary films shown in FIGS. 2 and 3.

The following modeling shows the variation of the optical properties of films with typical carrier concentration, mobility and film thickness for TCOs. FIGS. 2-4 show the absorption as a function of wavelength for four values of permittivity (4, 5, 6, 7). In each of these, carrier concentration and mobility were taken as $7 \times 10^{20}$ cm$^{-3}$ and 35 cm$^2$ V$^{-1}$ s$^{-1}$, respectively. The effective mass and film thickness were taken as 0.35 $m_e$ (mass of the electron) and 500 nm, respectively.

FIG. 2 is a plot showing modeled absorption, as a function of wavelength, for four exemplary TCO films. FIG. 3 is a plot showing modeled transmittance as a function of wavelength for the same set of exemplary films shown in FIG. 2. FIG. 4 is a plot showing modeled reflectance as a function of wavelength for the same set of exemplary films shown in FIGS. 2 and 3.

The peak of the absorption vs. wavelength curves occurs close to the plasma wavelength. As the real part of the permittivity is increased, it may be seen that the peak of the absorption moves to a longer wavelength. Consequently, the optical absorption is reduced on the short-wavelength sale of the plasma wavelength, which is desired for applications in the visible spectrum.

Accordingly, the method described above may be implemented to produce high quality sputtered $In_2O_3$:Zr films in pure Ar. Adding $ZrO_2$ to the target of traditional TCOs improves film transparency in the visible range of wavelengths. Adding $ZrO_2$ to the target of traditional TCOs also maintains high carrier concentration at higher oxygen partial pressures. The method may also be used to widen the process window during TCO production. It is noted that other refractory metal dopants (e.g., $In_2O_3$:Hf) and/or other TCO host materials may also be used.

It is readily appreciated that applications of this technology may include, but are not limited to, liquid crystal displays (LCDs), touch panel devices (e.g., personal digital assistants or PDAs), photovoltaic solar cells, transparent thin film transistors, low-emissivity window glass, and other opto-electronic applications.

By way of example, the development of multi-junction thin-film photovoltaic solar cell devices with 25% conversion efficiency may be accomplished by incorporating the TCO materials produced according to the methods described herein into photovoltaic devices that have much higher NIR transmission than found in traditional TCOs. Specifically, TCOs may be used having both a low sheet resistance and a high transmission between about 800 and 1300 nm.

The increased transmittance of the TCO materials produced according to the methods described herein may also enable lower power consumption in flat panel displays (and hence a longer battery lifetime). The TCOs may also exhibit enhanced wear-resistance, mechanical durability, and/or chemical resistance.

EXAMPLE

In this example, thin films were fabricated of a traditional TCO material doped with a small amount of a high-permittivity oxide. The goal was to gain an advantage in the optical properties from the high-$\varepsilon$ material without suffering loss of electrical quality. Films were produced by radio-frequency (RF) magnetron sputtering. Film composition was fixed by using sputtering targets that were custom fabricated using a small amount of $ZrO_2$ for the high-$\varepsilon$ component, and $In_2O_3$ doped with Sn (ITO) for the traditional (host) TCO component.

A 2 inch diameter sputtering target was produced by a commercial manufacturer using 1 weight percent (wt %) of fully oxidized zirconium oxide ($ZrO_2$) powder, 9 wt % of fully oxidized $SnO_2$ powder, and 90 wt % fully oxidized $In_2O_3$ powder. The mixture was hot pressed to the approximate target dimensions required, followed by mechanically sizing to more-accurate dimensions. The target was then fully re-oxidized using a high-temperature anneal in ambient oxygen.

Film deposition was conducted in a high-vacuum sputtering system that allows for control of an ambient environment containing both Ar and oxygen. Films were deposited onto Corning 1737 glass substrates at temperatures of 350° C. The RF sputtered films produced using the ITO/$ZrO_2$ target are referred to as "ITZO" films. The example also included fabrication of RF sputter deposited ITO films. The ITO sputtering target was produced as described above, except that it did not contain $ZrO_2$ (i.e., the mixture was 9 weight percent $SnO_2$ and 91 wt % $In_2O_3$). The ITO films were produced during the same time period so that the films could be used as "control samples" to isolate effects due to the high-$\varepsilon$ component, ($ZrO_2$), ITO. It should also be noted that the ITO films produced for this comparison are among the highest quality ITO films produced, and so a favorable comparison with these particular ITO films represents a very high standard.

Figure 5:
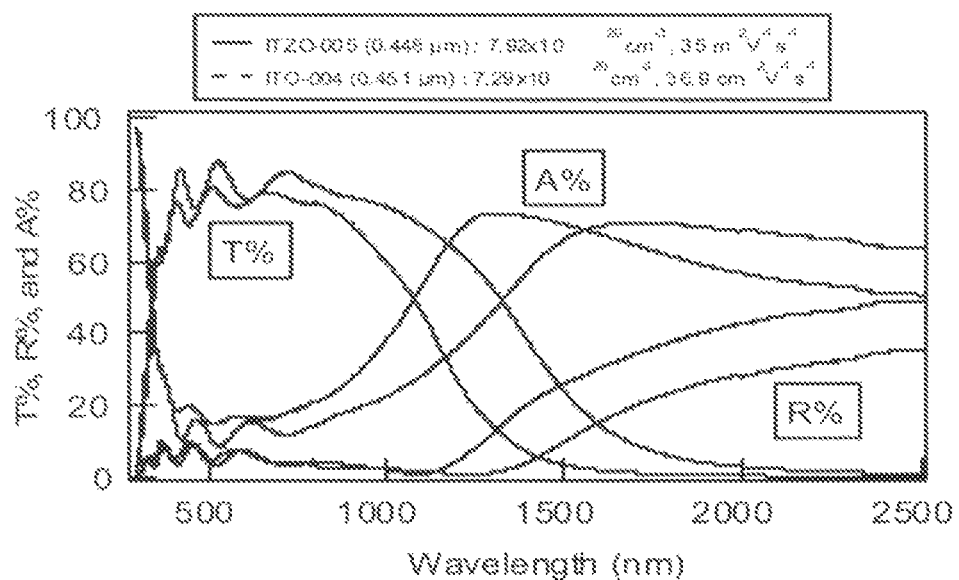
FIG. 5 is a plot comparing optical properties of exemplary ITZO and ITO films.
Figure 6:
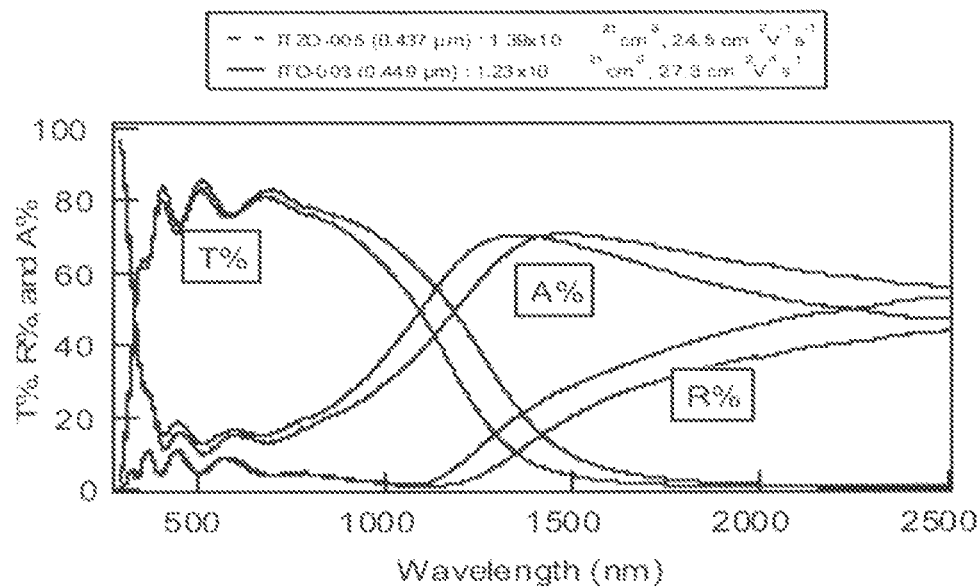
FIG. 6 is another plot comparing optical properties of exemplary ITZO and ITO films.

In FIGS. 5 and 6, we compare the ITO and ITZO films that we have produced. In each figure, we have been careful to choose films that demonstrate similar thickness and electrical properties (carrier concentrations and mobility, measured using room-temperature Hall measurements). This degree of film similarity minimizes effects due to free-carrier absorption.

FIG. 5 is a plot comparing optical properties of ITZO and ITO films. In this example, the ITZO and ITO films have similar thickness of about 450 nm, n of about $7 \times 10^{20}$ $cm^{-3}$, and μ of about 35 $cm^2$ $V^{-1}$ $s^{-1}$. FIG. 6 is another plot comparing optical properties of exemplary ITZO and ITO films. In this example, the ITZO and ITO films have similar thickness of about 440 nm, n of about $1.3 \times 10^{21}$ $cm^{-3}$, and μ of about 26 $cm^2$ $V^{-1}$ $s^{-1}$.

It is readily observed in FIGS. 5 and 6 that the ITZO films demonstrate significantly higher NIR transmission. The ITZO films also have good electrical quality (i.e., films were deposited with nearly identical n and μ at nearly identical thicknesses). It can also be seen that the behavior of the ITZO film is similar us that described. Hence, the addition of the $ZrO_2$, which has a very high permittivity, leads to the behavior observed in FIGS. 5 and 6.

It is noted that, although $ZrO_2$ and ITO were used in this example, similar high-$\in$ oxides (e.g., $TiO_2$, $HfO_2$, etc.) and/or other traditional host TCO materials ($SnO_2$:F, ZnO:Al, etc.) may also be used to produce similar results. It is also noted that the optical properties may be turned to longer or to shorter wavelengths using the permittivity as a control parameter. In addition, the work function of the host TCO may be changed by the addition of high-$\in$ oxides, because these also tend to have a large work function.

Figure 7:
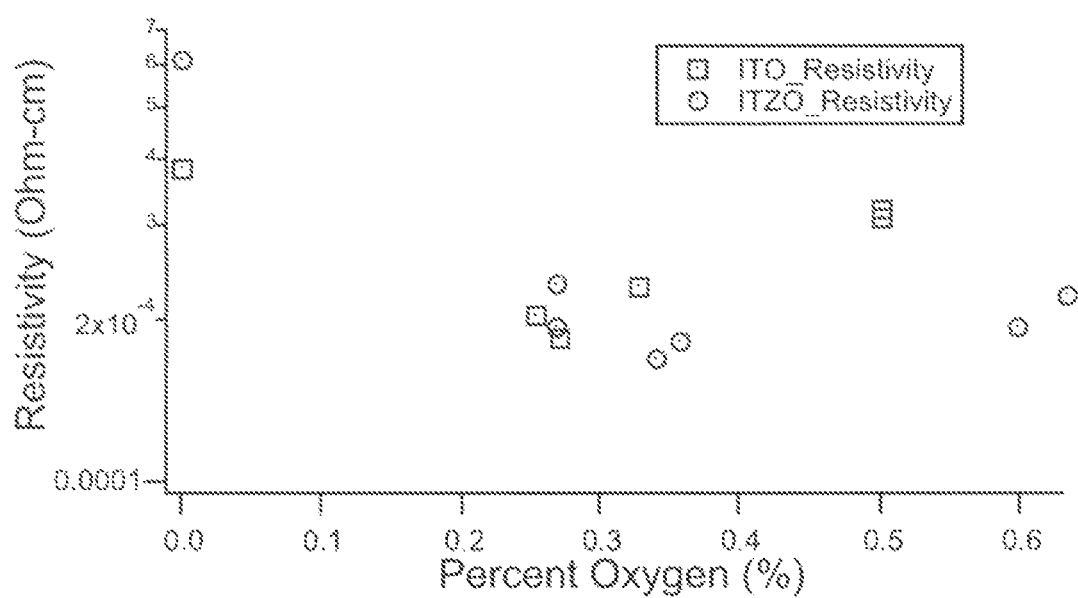
FIG. 7 is a plot showing optimizing the combination of electrical and optical properties of ITZO.

FIG. 7 is a plot comparing electrical and optical process window ranges of ITO and ITZO. It is observed that the combination of electrical and optical properties of ITZO can be optimized over a much wider range of oxygen partial pressure than typical ITO for a given resistivity (process windows shown for resistivity$\leq 3 \times 10^{-4}$ Ohm-cm).

At low levels of ambient oxygen, addition of Zr (or similar materials) to the $In_2O_3$ matrix (or similar TCOs) may limit the formation of low-transparency phases when the sputtering ambient environment cannot supply sufficient oxygen. But because Zr is also an effective donor in $In_2O_3$, both electrical and optical quality are maintained at low oxygen partial pressure.

At high levels of ambient oxygen, addition of Zr (or similar materials) to the $In_2O_3$ matrix may getter excess oxygen into strong $ZrO_2$ bonding, allowing oxygen vacancies to be retained as donors and/or limiting detrimental effects of interstitial oxygen in the $In_2O_3$ lattice. This may be similar to the gettering process in non-evaporative getter (NEG) materials where Zr is also used because of its high reactivity.

Both of these results can provide advantages in a TCO production environment because the range of oxygen partial pressure where optimum films are produced is extended, and because optimization is enabled by the target composition rather than the (less predictable) sputtering ambient environment.

The Example discussed above is provided for purposes of illustration and is not intended to be limiting. Still other embodiments and modifications are also contemplated.

While a number of exemplary aspects and embodiments have been discussed above, those of skill in the art will recognize certain modifications, permutations, additions and sub combinations thereof. It is therefore intended that the following appended claims and claims thereafter introduced are interpreted to include all such modifications, permutations, additions and sub-combinations as are within their true spirit and scope.

The invention claimed is:

1. A method of producing a transparent conducting oxide (TCO) thin film, comprising:
   in a process chamber, providing a TCO target including a host TCO component, wherein the TCO target contains an amount of an oxide selected based on permittivity;
   providing a substrate in the process chamber; and
   depositing a metal oxide on the substrate from the host TCO component and the oxide of the TCO target in the process chamber to form a thin film, wherein the amount of the oxide provided in the TCO target is selected such that the thin film has a higher permittivity than the host TCO component,
   wherein the depositing comprises sputter depositing or bombarding the TCO target with ions from an ion source in an ambient environment of argon and less than about 0.6 percent oxygen in the process chamber.

2. A method of producing a transparent conducting oxide (TCO) thin film, comprising:
   in a process chamber, providing a TCO target including a host TCO component, wherein the TCO target contains an amount of an oxide selected based on permittivity;
   providing a substrate in the process chamber; and
   depositing a metal oxide on the substrate from the host TCO component and the oxide of the target in the process chamber to form a thin film, wherein the amount of the oxide provided in the TCO target is selected such that the thin film has a higher permittivity than the host TCO component,
   wherein the depositing comprises sputter depositing the metal oxide in an ambient environment comprising a mixture of less than about 0.8 percent oxygen and argon.

3. The method of claim 1, wherein the depositing comprises sputter depositing the metal oxide from a metal target in a mixture of oxygen and argon.

4. The method of claim 1, wherein the depositing comprises sputter depositing the metal oxide in a mixture of oxygen, hydrogen, and argon.

5. The method of claim 1, wherein the step of depositing occurs at about 350° C.

6. A method of producing a transparent conducting oxide (TCO) thin film, comprising:
   in a process chamber, providing a TCO target including a host TCO component, wherein the TCO target contains an amount of an oxide selected based on permittivity;
   providing a substrate in the process chamber; and
   depositing a metal oxide on the substrate from the host TCO component and the oxide of the target in the process chamber to form a thin film, wherein the amount of the oxide provided in the TCO target is selected such that the thin film has a higher permittivity than the host TCO component,
   wherein the host TCO component comprises $In_2O_3$ doped with Sn and the oxide provided in the TCO target comprises $ZrO_2$ and further wherein the step of depositing comprises sputtering in an ambient environment in the process chamber of argon and less than about 0.6 percent oxygen to produce a Zr doped $In_2O_3$ TCO thin film that demonstrates a higher permittivity than the host TCO component.

7. The method of claim 1, wherein oxide provided in the TCO target is selected from the group of oxides consisting of: $Nb_2O_5$, $V_2O_5$, $TiO_2$, $ZrO_2$, and $HfO_2$.

8. The method of claim 7, wherein the amount of the high-permittivity material is at least about 1 weight percent of the selected high-permittivity oxide.

9. A method of producing a thin film, comprising:
providing, in a process chamber, a substrate and a target comprising a host oxide and an oxide comprising at least one of $Nb_2O_5$, $V_2O_5$, $TiO_2$, $ZrO_2$ and $HfO_2$;
controlling an ambient environment in the process chamber about the target using a mixture of argon and oxygen, wherein the mixture includes less than about 0.8 percent oxygen; and
on the substrate, depositing a transparent conductive oxide (TCO) thin film from the target.

10. The method of claim 9, wherein the mixture includes less than about 0.6 percent oxygen.

11. The method of claim 10, wherein the host oxide comprises $In_2O_3$:Sn, $SnO_2$:F, or ZnO:Al.

12. The method of claim 9, wherein the oxide comprising at least one of $Nb_2O_5$, $V_2O_5$, $TiO_2$, $ZrO_2$, and $HfO_2$ is provided in the target in an amount of at least about 1 weight percent.

13. A method of producing a thin film, comprising:
providing, in a process chamber, a substrate and a TCO target with an added amount of an oxide, wherein the TCO target includes a host oxide that is $In_2O_3$:Sn, $SnO_2$:F, or ZnO:Al;
providing an ambient environment in the process chamber including a mixture of argon and oxygen, wherein the mixture includes less than about 0.8 percent oxygen; and
performing sputtering in the process chamber to deposit a transparent conductive oxide (TCO) thin film from the target onto the substrate, wherein the thin film has a permittivity greater than a permittivity of a host oxide provided in the thin film by the TCO target.

14. The method of claim 13, wherein the mixture includes less than about 0.6 percent oxygen.

15. The method of claim 13, wherein the oxide in the TCO target includes at least one of $Nb_2O_5$, $V_2O_5$, $TiO_2$, $ZrO_2$, or $HfO_2$.

16. The method of claim 13, wherein at least about 1 weight percent of the oxide is added to the TCO target.

* * * * *